United States Patent [19]

Higaki et al.

[11] Patent Number: 5,051,398
[45] Date of Patent: Sep. 24, 1991

[54] PROCESS FOR PREPARING A BISMUTH-TYPE SUPERCONDUCTING THIN FILM

[75] Inventors: Kenjiro Higaki; Keizo Harada; Naoji Fujimori; Hideo Itozaki; Shuji Yazu, all of Hyogo, Japan

[73] Assignee: Sumitomo Electric Industries, Ltd., Osaka, Japan

[21] Appl. No.: 399,739

[22] Filed: Aug. 28, 1989

[30] Foreign Application Priority Data

Aug. 29, 1988 [JP] Japan .................................. 63-214130

[51] Int. Cl.$^5$ ....................... C23C 14/34; H01L 39/24
[52] U.S. Cl. ....................................... 505/1; 505/730; 505/731; 505/732; 505/742; 505/782; 427/62; 204/192.24
[58] Field of Search ...................... 204/192.24, 192.31; 505/1, 816, 725, 731, 732, 742, 775, 782, 784, 730; 427/62

[56] References Cited

U.S. PATENT DOCUMENTS 4,866,032 9/1989 Fujimori et al. ..................... 505/1
4,996,190 2/1991 Higaaki et al. ..................... 505/1

OTHER PUBLICATIONS

A. B. Harker, et al., Appl. Phys. Lett., 52(25), pp. 2186–2187, Jun. 20, 1988.
C. E. Rice et al., Appl. Phys. Lett., 52(21), pp. 1828–1830, May 23, 1988.
Brian T. Sullivan et al., Appl. Phys. Lett., 52, (23), pp. 1992–1994, Jun. 6, 1988.

*Primary Examiner*—Aaron Weisstuch
*Attorney, Agent, or Firm*—Pennie & Edmonds

[57] ABSTRACT

In a process for depositing a superconducting thin film of bismuth-containing compound oxide on a substrate by physical vapor deposition, the improvement wherein the substrate is heated at a temperature between 670° and 750° C. during the deposition.

15 Claims, No Drawings

PROCESS FOR PREPARING A BISMUTH-TYPE SUPERCONDUCTING THIN FILM

BACKGROUND OF THE INVENTION

1. Field of the Invention

The present invention relates to a process for preparing a superconducting thin film of bismuth-containing compound oxide. More particularly, it relates to an improved process for depositing on a substrate a bismuth (Bi) type superconducting thin film possessing an improved high critical current density (Jc) as well as a high critical temperature (Tc).

2. Description of the Related Art

Superconductivity is a phenomenon which is explained as a kind of phase change of electrons under which the electric resistance becomes zero and perfect diamagnetism is observed.

Several superconducting devices have been proposed and developed in electronics, which is a typical field to which the superconducting phenomenon is applicable. A typical application of a superconductor is Josephson device, in which quantum efficiency is observed macroscopically when an electric current is passed through a weak junction arranged between two superconductors. The tunnel junction type Josephson device is expected to be a high-speed and low-power consuming switching device owing to a smaller energy gap of the superconducting material. It is expected that the Josephson device will be utilized as a high-sensitivity sensor or detector for sensing very weak magnetic fields, microwaves, radiant rays or the like since variation of an electromagnetic wave or magnetic field is reflected in a variation of the Josephson effect and can be observed as a precise quantum phenomenon. Development of superconducting devices such as high-speed logic units or of no powerloss wiring materials is also demanded in the field of high-speed computers in which the power consumption per unit area is reaching the upper limit of the cooling capacity with increment of the integration density in order to reduce energy consumption. The critical temperature "Tc" of superconductivity, however, could not exceed 23.2° K. of $Nb_3Ge$, which was the the highest Tc for the past ten years.

The possibility of existence of new types of superconducting materials having much higher Tc was revealed by Bednorz and Müller, who discovered a new oxide type superconductor in 1986 (*Z. Phys.* B64, 1986, p189).

It had been known that certain ceramic materials of compound oxides exhibit the property of superconductivity. For example, U.S. Pat. No. 3,932,315 discloses a Ba—Pb—Bi type compound oxide which shows superconductivity and Japanese patent laid-open No. 60-173,885 discloses that Ba—Bi type compound oxides also show superconductivity. These superconductors, however, possess rather lower transition temperatures of about 10° K. and hence usage of liquefied helium (boiling point of 4.2° K.) as a cryogen is indispensable to realize superconductivity.

The new type compound oxide superconductor discovered by Bednorz and Müller is represented by [La, Sr]$_2$CuO$_4$, which is called a $K_2NiF_4$-type oxide having a crystal structure which is similar to known perovskite type oxides. The $K_2NiF_4$-type compound oxides shows higher Tc such as 30° K., which is extremely higher than known superconducting materials.

It was also reported in February 1987 that C. W. Chu et al. discovered, in the United States of America, another superconducting material, the so called YBaCuO type represented by $YBa_2Cu_3O_{7-x}$ having a critical temperature of about 90° K. (*Physical Review Letters*, Vol. 58, No. 9, p908).

An other type of new superconducting material is a compound oxide of Bi—Sr—Ca—Cu—O system reported by Maeda et al (*Japanese Journal of Applied Physics*, Vol. 27, No. 2, pp1209-1210). The bismuth-type compound oxides including this Bi—Sr—Ca—Cu—O system have such advantages that they are chemically much stabler and can be prepared with reduced cost because they contain no rare earth elements.

The above-mentioned new types of superconducting materials can be obtained by solid reaction in a bulk form of a sintered block obtained by sintering a powder mixture of oxides or carbonates of constituent metal elements. They can also be deposited on a substrate in the form of a thin film by physical vapor deposition (PVD) techniques such as RF sputtering, vacuum deposition, ion-plating or MBE or chemical vapor deposition (CVD) techniques such as thermal CVD, plasma CVD, photo-CVD or MOCVD. It is a usual practice to subject the resulting thin films to heat-treatment in an oxygen-containing atmosphere to adjust the oxygen deficiency in the crystal.

The present applicant already proposed several processes for preparing thin films of the high-Tc superconductor on a substrate in the following patent applications: U.S. patent application Ser. No. 152,714 filed on Feb. 2, 1988 (now abandoned), U.S. patent application Ser. No. 167,895 filed on Mar. 13, 1988 (now abandoned), U.S. patent application Ser. No. 195,145 filed on May 18, 1988 (now U.S. Pat. No. 4,900,716), U.S. patent application Ser. No. 195,147 filed on May 18, 1988 (now abandoned), U.S. patent application Ser. No. 200,206 filed on May 31, 1988 (now U.S. Pat. No. 4,996,185), U.S. patent application Ser. No. 286,860 filed on Dec. 20, 1988 (pending), U.S. patent application Ser. No. 289,718 filed on Dec. 25, 1988 (pending), U.S. patent application Ser. No. 289,719 filed on Dec. 25, 1988 (pending), and U.S. patent application Ser. No. 290,309 filed on Dec. 26, 1988. The present invention has been completed along the same line as these patent applications.

The present invention concerns the superconducting thin films of bismuth (Bi) type compound oxide. This type superconducting thin film has been prepared by deposition techniques such as RF sputtering, vacuum deposition or MO-CVD technique. They possess, however, very low critical current density (Jc) although they showed very high critical temperature (Tc), so that they were difficult to utilize in practical uses such as electronic devices or wiring materials.

An object of the present invention is to overcome the shortcomings of the conventional bismuth (Bi) type superconducting thin films and to provide an improved process for increasing the critical current density (Jc) thereof.

SUMMARY OF THE INVENTION

The present invention provides an improved process for depositing a superconducting thin film of a compound oxide containing at least bismuth and copper on a substrate by a physical vapor deposition technique, characterized in that the substrate is heated at a temperature between 670° and 750° C., preferably between 670° and 720° C., more preferably between 680° and 710° C. during the deposition.

According to a preferred embodiment, the deposited thin film is further annealed at a temperature between 870° and 910° C., preferably between 880° and 905° C. This annealing operation is effected preferably for a time duration between 10 minutes and 10 hours. This annealing operation is carried out preferably in an oxygen gas containing atmosphere or in the presence of oxygen gas. The pressure of oxygen gas is preferably about 1 atm.

The present invention has been completed on the basis of the finding of the present inventors that the superconducting property of thin films of compound oxide containing at least bismuth and copper deposited by a physical vapor deposition technique is critically influenced by the substrate temperature and hence the substrate temperature must be precisely controlled.

In fact, a superconducting thin film made of e.g. Bi—Sr—Ca—Cu type compound oxide which was prepared by the conventional processes has a very poor critical current density (Jc), although the thin film possesses a very high critical temperature (Tc) of higher than 100° K. Namely, the highest critical current density (Jc) observed in the known thin film of bismuth (Bi) type compound oxide deposited on a substrate has been about 10,000 A/cm$^2$, which is inadequate for practical applications. The present inventors tried by a variety of experiments to find the best conditions in order to improve the critical current density (Jc) and found that the quality of the deposited thin film is critically influenced by the substrate temperature during the deposition stage and finally found that the critical current density (Jc) can be improved remarkably by precisely controlling the substrate temperature.

According to the experiments which were conducted by the present inventors, the critical current density (Jc) drops sharply when the substrate temperature is selected outside a range between 670° and 750° C., more precisely between 670° and 720° C. and even more precisely between 680° and 710° C., during the deposition.

The present inventors also found that an effective result is obtained when the annealing of the deposited thin film is effected under a predetermined condition. Namely, according to the present invention, it is very important to heat the substrate at a temperature between 870° and 910° C., preferably between 880° and 905° C. It was experienced that the superconducting property of the thin film became relatively worse when the annealing is effected outside the above-mentioned annealing condition.

DESCRIPTION OF THE PREFERRED EMBODIMENT

The substrate on which the thin film is deposited is preferably a single crystal of MgO, SrTiO$_3$, LaAlO$_3$, LaGaO$_3$ or the like. The superconducting thin film according to the present invention is preferably deposited on a {001} plane or {110} plane of these single crystals.

The superconducting thin film according to the present invention can be deposited on a substrate by a physical vapor deposition (PVD) technique such as sputtering, vacuum deposition or ion-plating, preferably by RF (radio-frequency) magnetron sputtering.

The target is preferably a sintered mass or sintered powder of a compound oxide composed of constituent metal elements from which the thin film is made and oxygen. Such sintered mass or sintered powder can be prepared by mixing powders of oxides, carbonates, nitrate or fluorides each containing at least one of the constituent metal elements of the thin film to be deposited in such a manner that a powder mixture contains the constituent metal elements in predetermined atomic ratios and then by sintering the powder mixture. The sputtering gas is preferably a mixture of argon and oxygen, and the percentage of oxygen is preferably 10 to 60%. The pressure of the sputtering gas is preferably between $1 \times 10^{-2}$ and $1 \times 10^{-1}$ Torr. During the sputtering, it is preferable to apply high-frequency power of 0.064 to 1.27 W/cm$^2$ to the target. The sputtering is continued for a time which is required to obtain a thin film of a desired thickness. The deposition rate is preferably between 0.05 and 1 Å/min.

The sintered mass or sintered powder can be used as a vapor source in the vacuum deposition technique and ion plating technique.

The present invention is applicable for any superconductor composed of a compound oxide containing bismuth (Bi), preferably a typical bismuth type compound oxide of Bi, Sr, Ca and Cu represented by the general formula:

$$Bi_4(Sr_{1-x}, Ca_x)_m Cu_n O_{p+y}$$

in which "m", "n", "x" and "y" are numbers each satisfying respective ranges of $6 \leq m \leq 10$, $4 \leq n \leq 8$, $0 < x < 1$ and $-2 \leq y \leq +2$ and $p = (6+m+n)$.

As typical compound oxides of this type, the following systems can be mentioned: $Bi_2Sr_2Ca_2Cu_3O_{10-y}$ and $Bi_4Sr_4Ca_4Cu_6O_{2(10-y)}$.

As the other type bismuth-containing compound oxides to which the present invention is applicable, the following systems can be mentioned:

| | |
|---|---|
| (Bi, Tl, Pb)—Ca—Sr—Cu—O system | (110K), |
| Bi—Y—Ba—Cu—O system | (100K), |
| Bi—Pb—Sr—Ca—Cu—O system | (107K), |
| Bi—(Sr, Ln)—Cu—O system | (30 to 42K), | wherein "Ln" stands for lanthanide elements.

The thin film of the bismuth type compound oxide obtained by the process according to the present invention shows remarkably improved critical current density (Jc) without spoiling its inherent high critical temperature (Tc), so that it becomes possible to develop a variety of superconducting devices including Josephson Devices which are operable at high temperatures above the boiling point of liquid nitrogen.

Now, the present invention will be described with reference to examples, but the scope of the invention should not be limited to them.

EXAMPLES

Several superconducting thin films of Bi—Sr—Ca—Cu type compound oxide were prepared by the RF-magnetron sputtering method.

The target used in the RF-magnetron sputtering was prepared by intimately mixing powders of commercially available BiCO$_3$, SrCO$_3$, CaCO$_3$ and CuO in such a manner that the atomic ratios of the respective elements Bi, Sr, Ca and Cu in the resulting powder mixture were 1.4:1.0:1.0:1.5 and then sintering the powder mixture at 800° C. for 8 hours. The resulting sintered mass of Bi—Sr—Ca—Cu type compound oxide was used as the target.

The substrate was a single crystal of MgO. The thin film was deposited on the {110} plane of the MgO substrate.

Six samples of thin films were prepared at different substrate temperatures. The RF-magnetron sputtering was effected for all samples under the following common conditions except for the substrate temperature:

Sputtering gas: a mixed gas of Ar and $O_2$ $O_2/(Ar+O_2)=0.2$ (vol %)
Sputtering gas pressure: $2 \times 10^{-2}$ Torr
High-frequency power: 50 W (0.64 W/cm$^2$).

Deposition of all thin films was continued until a thin film of 2,000 Å thickness was obtained.

It was confirmed that the resulting thin films became superconductors by measuring the critical temperature. After that, the critical current density (Jc) of the respective thin films was measured at 77.3° K. Table 1 shows the critical current density (Jc) of respective thin films obtained as well as the substrate temperatures adopted.

TABLE 1

| Sample No | Substrate temperature during deposition (°C.) | Critical current density (A/cm$^2$, 77.3K) |
|---|---|---|
| 1 | 660 | 0 |
| 2 | 680 | $1.0 \times 10^5$ |
| 3 | 690 | $1.2 \times 10^6$ |
| 4 | 700 | $9.5 \times 10^5$ |
| 5 | 720 | $5.8 \times 10^5$ |
| 6 | 760 | 0 |

Then, five other samples were prepared under the same conditions as Sample 3 which showed the highest critical current density (Jc). Then, these five samples were subjected to annealing at different temperatures shown in Table 2 in an oxygen gas stream supplied at a rate of 0.6 liter/cm$^2$ for 60 minutes.

The critical current density (Jc) of the resulting thin films was measured by the same method as above. The results are summarized in Table 2.

TABLE 2

| Sample No | annealing temperature (°C.) | Critical current density (A/cm$^2$, 77.3K) |
|---|---|---|
| 7 | 860 | 0 |
| 8 | 880 | $1.2 \times 10^5$ |
| 9 | 890 | $9.8 \times 10^5$ |
| 10 | 900 | $1.7 \times 10^6$ |
| 11 | 925 | 0 |

From the results shown above, it is apparent that the critical current density (Jc) of superconducting thin films of Bi—Sr—Ca—Cu type compound oxide is influenced strongly by the substrate temperature during deposition and by the annealing temperature. In other words, the critical current density of the superconducting thin films of this type can be improved by controlling these temperatures.

We claim:

1. A process for depositing a superconducting thin film of a compound oxide containing at least bismuth and copper on a substrate of MgO in an oxygen-containing atmosphere by a physical vapor deposition technique, characterized in that said thin film is deposited on a {110} plane of the MgO substrate which is heated at a temperature between 670° and 750° C. during the deposition.

2. The process set forth in claim 1 wherein the deposited thin film is further annealed at a temperature between 870° and 910° C.

3. The process set forth in claim 2 wherein the annealing is effected for more than 10 minutes.

4. The process set forth in claim 1 wherein the physical vapor deposition technique is sputtering.

5. The process set forth in claim 4 wherein the target used in the sputtering is a sintered block or sintered powder of a compound oxide containing metal elements which are constituent elements of the compound oxide of the thin film to be deposited.

6. The process set forth in claim 5 wherein said sintered block or sintered powder is prepared by mixing powders of oxides, carbonates, nitrate or fluorides each containing at least one of the constituent metal elements of the thin film to be deposited in such a manner that a powder mixture contains the constituent metal elements in predetermined atomic ratios and then by sintering the powder mixture.

7. The process set forth in claim 4 wherein the sputtering is performed in a gas mixture of argon and oxygen, the percentage of oxygen being 10 to 60%.

8. The process set forth in claim 4 wherein the pressure of the sputtering gas is between $1 \times 10^{-2}$ and $1 \times 10^{-1}$ Torr.

9. The process set forth in claim 4 wherein the thin film is deposited at a rate between 0.05 and 1 Å/min.

10. The process set forth in claim 1 wherein the deposited thin film is made of a compound oxide of Bi, Sr, Ca and Cu.

11. The process set forth in claim 10 wherein the compound oxide consists mainly of compound oxides represented by the general formula:

$$Bi_4(Sr_{1-x}, Ca_x)_m Cu_n O_{p+y}$$

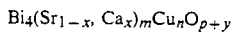

in which "m", "n", "x" and "y" are numbers each satisfying respective ranges of $6 \leq m \leq 10$, $4 \leq n \leq 8$, $0 < x < 1$ and $-2 \leq y \leq +2$ and $p=(6+m+n)$.

12. The process set forth in claim 10 wherein the physical vapor deposition technique is sputtering.

13. The process set forth in claim 12 wherein the target used in the sputtering is a sintered block or sintered powder of a compound oxide containing metal elements which are constituent elements of the compound oxide of the thin film to be deposited.

14. The process set forth in claim 12 wherein the sputtering is performed in a gas mixture of argon and oxygen, the percentage of oxygen being 10 to 60%.

15. The process set forth in claim 14 wherein the pressure of the sputtering gas is between $1 \times 10^{-2}$ and $1 \times 10^{-1}$ Torr.

* * * * *